United States Patent
Ali (10) Patent No.: US 9,276,534 B2
(45) Date of Patent: Mar. 1, 2016

(54) HIGH SPEED AMPLIFIER (71) Applicant: Ahmed Mohamed Abdelatty Ali, Oak Ridge, NC (US)

(72) Inventor: Ahmed Mohamed Abdelatty Ali, Oak Ridge, NC (US)

(73) Assignee: ANALOG DEVICES, INC., Norwood, MA (US)

(*) Notice: Subject to any disclaimer, the term of this patent is extended or adjusted under 35 U.S.C. 154(b) by 148 days.

(21) Appl. No.: 14/012,165

(22) Filed: Aug. 28, 2013

(65) Prior Publication Data
US 2015/0061776 A1   Mar. 5, 2015

(51) Int. Cl.
*H03F 3/193*   (2006.01)
*H03F 1/02*    (2006.01)
*H03F 3/195*   (2006.01)

(52) U.S. Cl.
CPC .............. *H03F 3/193* (2013.01); *H03F 1/0266* (2013.01); *H03F 3/195* (2013.01); *H03F 3/1935* (2013.01); *H03F 2200/18* (2013.01); *H03K 2217/0018* (2013.01)

(58) Field of Classification Search
USPC .................. 330/286, 285, 252–261
See application file for complete search history.

(56) References Cited

U.S. PATENT DOCUMENTS

| | | | |
|---|---|---|---|
| 6,064,262 A * | 5/2000 | Wang ........................... | 330/253 |
| 6,586,958 B2 | 7/2003 | Sudo et al. | |
| 7,679,446 B2 * | 3/2010 | Kim et al. ..................... | 330/282 |
| 7,714,652 B2 * | 5/2010 | Mangudi et al. .............. | 330/253 |
| 8,577,325 B2 | 11/2013 | Lee et al. | |
| 2002/0149425 A1 | 10/2002 | Chawla et al. | |
| 2003/0076172 A1 | 4/2003 | Tichauer | |
| 2003/0141929 A1 | 7/2003 | Casper et al. | |
| 2006/0071735 A1 | 4/2006 | Kang | |
| 2008/0007357 A1 | 1/2008 | Tserng et al. | |
| 2008/0315950 A1 | 12/2008 | Koh et al. | |
| 2010/0103572 A1 | 4/2010 | Worley | |
| 2010/0182093 A1 | 7/2010 | Hasegawa | |
| 2012/0139643 A1 | 6/2012 | Scott et al. | |
| 2013/0127539 A1 | 5/2013 | Murakami | |

FOREIGN PATENT DOCUMENTS

| | | |
|---|---|---|
| EP | 0975089 A2 | 1/2000 |
| JP | H02301321 A | 12/1990 |

OTHER PUBLICATIONS

F. Schlogl et al., "1.5 GHz OPAMP in 120nm Digital CMOS", Proceedings of the 30th European Solid-State Circuits Conference (ESSCIRC 2004), pp. 239-242, Sep. 2004.
S. Heng et al., "A Low-Power High-PSRR Low-Dropout Regulator With Bulk-Gate Controlled Circuit", IEEE Transactions on Circuits and Systems II: Express Briefs, vol. 57, No. 4, pp. 245-249, Apr. 2010.
Extended European Search Report and Search Opinon issued in European application No. 14181177.8, communication dated Feb. 20, 2015 (9 pages).
Extended European Search Report and Search Opinon issued in European application No. 14181179.4, communication dated Mar. 2, 2015 (10 pages).

* cited by examiner

*Primary Examiner* — Hieu Nguyen
(74) *Attorney, Agent, or Firm* — Kenyon & Kenyon LLP (57) ABSTRACT

A circuit may include one or more transistors connected directly to an output, and a biasing network connected to at least one of a substrate, a well, and a back-gate of at least one of the transistors. The biasing network may bias the at least one of the substrate, the well, and the back-gate to a virtual floating bias, such that the virtual floating bias shifts in voltage level based upon an AC input signal of the circuit, to reduce the parasitic capacitance of the output node of the circuit.

20 Claims, 7 Drawing Sheets

HIGH SPEED AMPLIFIER

BACKGROUND

In an amplifier, there may be a non-dominant frequency pole whose frequency value is proportional to gm/C, where gm is the transconductance of the output stage and C is the total capacitance at the output node (for example, C may include the capacitance of the load at the output node, the capacitance of the output node itself, and parasitic capacitances).

For high speed applications, the non-dominant pole may need to be pushed out to high frequencies. A low non-dominant pole frequency can lead to bad phase margin (under-damped behavior) and low bandwidth. To increase the frequency of the non-dominant pole, the amplifier may be designed with increased current in the output stage of the amplifier to increase the gm of the output stage. This, however, may lead to increasing power consumption. Additionally, as gm/C may be inherently limited by manufacturing process, increasing current may not be sufficient to increase the non-dominant pole of the output stage.

Accordingly, there is a need for an amplifier with increased or improved non-dominant pole frequencies with improved bandwidth and settling time, without increasing the current of the output stage.

DETAILED DESCRIPTION

Figure 1:
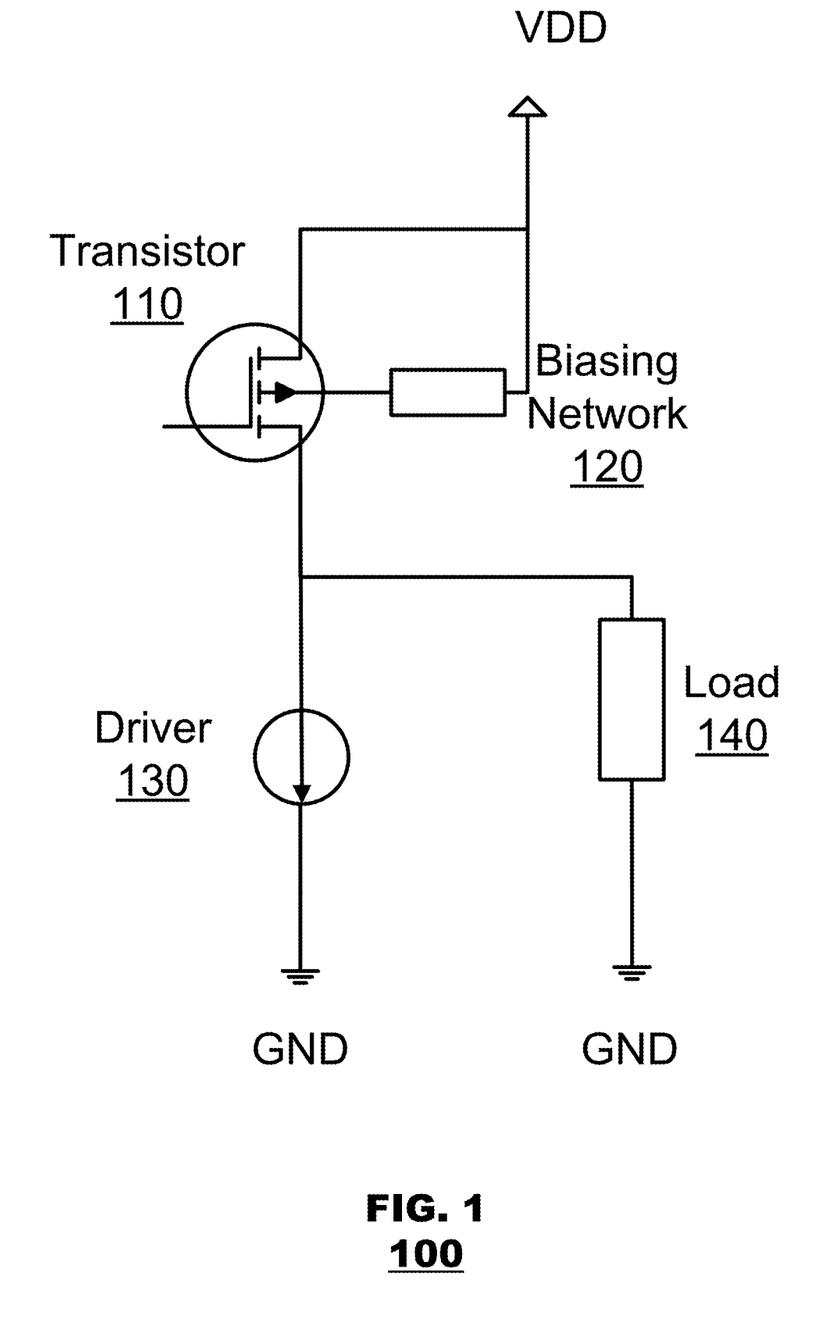
FIG. 1 illustrates a circuit according to an embodiment of the present disclosure.

According to an embodiment illustrated in FIG. 1, a circuit 100 may include a transistor 110, and a biasing network 120. The transistor 110 may be output on an output node to drive a load 140. The biasing network 120 may be connected to the transistor 110 to bias at least one of a substrate and a back-gate of the transistor 110 to a virtual floating bias, such that at least one of a substrate, a well, and a back-gate of the transistor 110 shifts in voltage level when the output node outputs an AC signal.

In FIG. 1, circuit 100 may be an amplifier circuit. Transistor 110 may be a PMOS (P-type Metal Oxide Silicon) transistor. Transistor 110 may have a gate connected to an input AC signal to be amplified. Driver 130 may be a current driver connected in series with the transistor 110 between supplies VDD and GND, to generate the output node to drive the load 140.

Alternatively, transistor 110 may be a current driving transistor configured to bias a current through the amplifier circuit 100. In such a case, the driver 130 may receive the input signal to be amplified.

In the above configurations, transistor 110 may be connected to VDD on its source node, to the output node on its drain node, and the back-gate (or NWELL) is in series with the biasing network 120 to the supply VDD. The transistor 110 may have one of its back-gate, substrate, and well connected to the biasing network 120, such that the biasing network 120 controls the biasing on one of the back-gate, substrate, and well of the transistor 110 to be a virtual floating bias. The virtual floating bias may be such that when the output of the transistor 110 outputs lower frequency range signals, one of its back-gate, substrate, and well of the transistor 110 appears to be floating, i.e. able to shift voltage level according to the signal at the input and the output.

Figure 2:
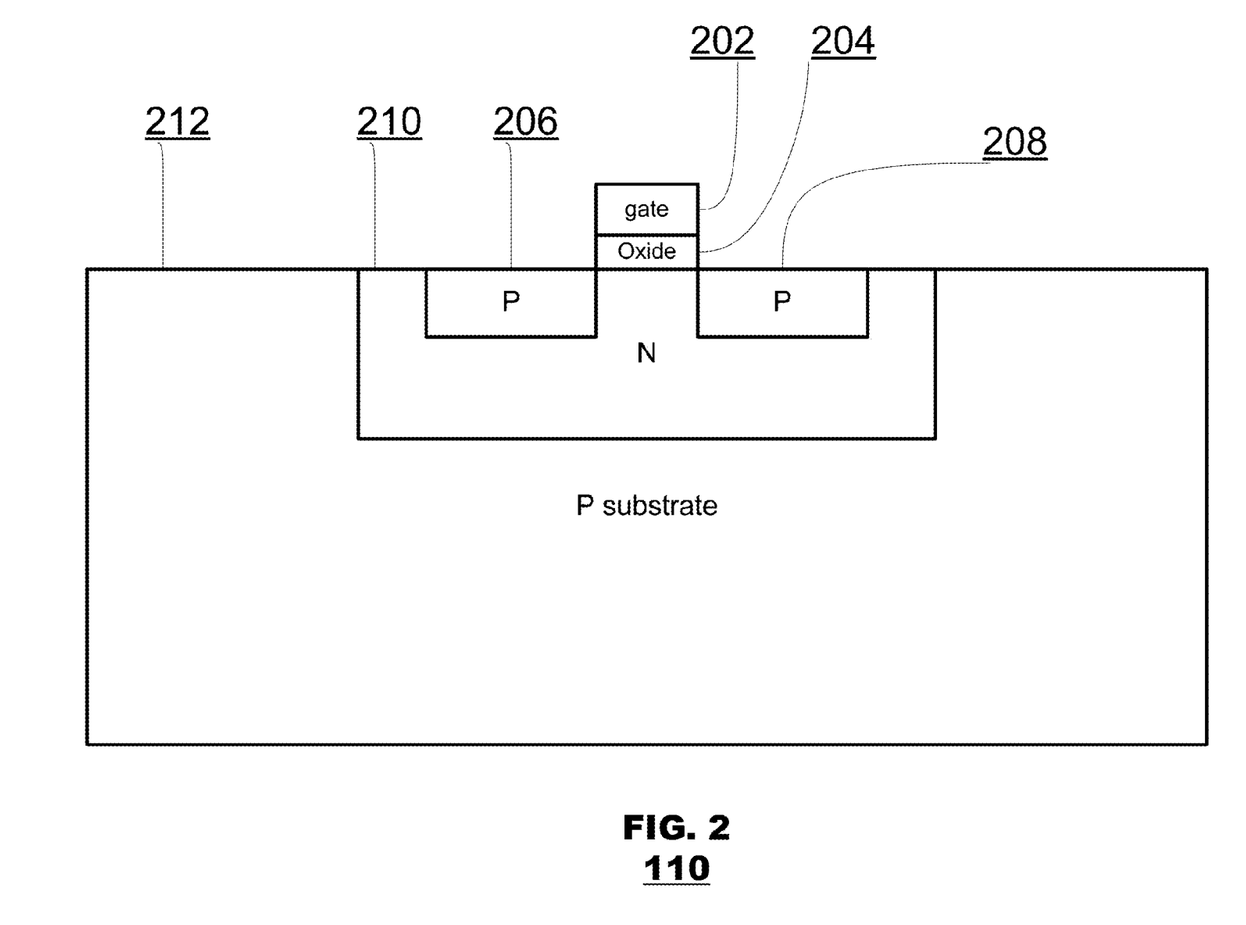
FIG. 2 illustrates a cross-sectional diagram of a transistor in a circuit according to an embodiment of the present disclosure.

FIG. 2 illustrates an idealized cross-sectional diagram of the transistor 110.

The transistor 110 may be a PMOS with a gate 202 with a gate oxide layer 204, a P-doped source region 206, a P-doped drain region 208, a N-doped well region 210, a P type substrate 212.

According to an embodiment implemented in circuit 100, the transistor 110 may have one of its N-doped well region (back-gate) 210, P type substrate 212, connected to biasing network 120. Various taps, such as diffusion or metal taps, may be implemented in the above portions of transistor 110 to connect to the biasing network 120. Additionally, the biasing network 120 may be connected to DC biasing voltages, to prevent forward biasing substrate junctions of the transistor 410.

Figure 3:
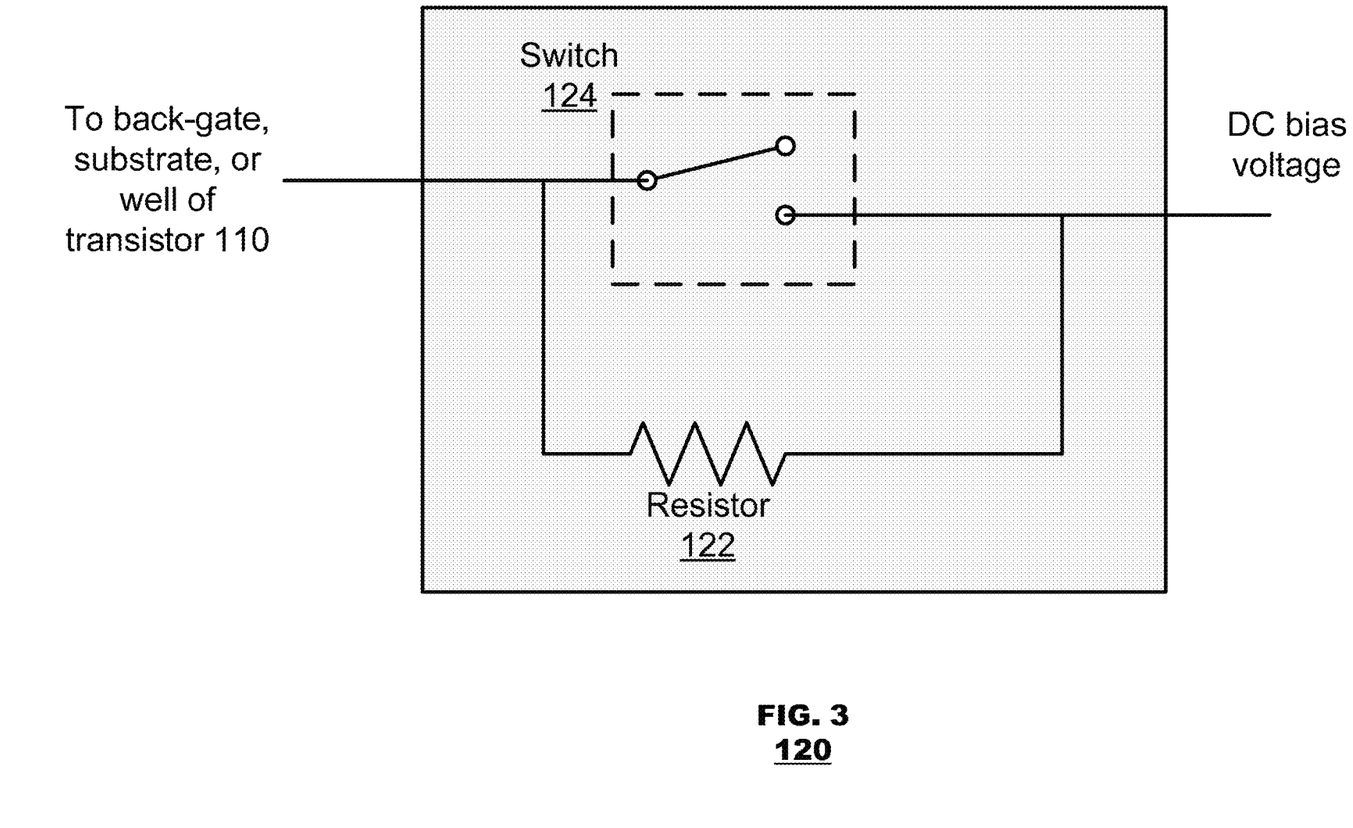
FIG. 3 illustrates a biasing network according to an embodiment of the present disclosure.

FIG. 3 illustrates a biasing network 120.

The biasing network 120 may include one of a resistor 122, and a switch 124.

The virtual float bias may be done by connecting one of back-gate, substrate, and well of the transistor 110 to a biasing voltage (for example, VDD or GND), through a very large resistor, for example having resistance of 200 kilo-ohms to 1 mega-ohms, that effectively one of its back-gate, substrate, and well of the transistor 110 to act as a floating node or an open circuit in the low frequency range of the circuit 100.

Alternatively, one of back-gate, substrate, and well of the transistor 110 may be connected to a switch 124, to be switched between two states, where one of back-gate, substrate, and well of the transistor 110 may be connected to a bias voltage (for example, VDD or GND) in a reset (off) phase (when the circuit 100 is not operational or resetting), and floated completely in the operational phase (when the circuit 100 is operating to output signal). In the reset phase, the back-gate, the substrate, or the well may be set to a DC bias voltage to effective reset the transistor 110 to prevent drifting of the transistor voltage levels. Additionally the switch 124 may be controlled by a controller (not shown) to periodically enter reset phases to prevent drifting of the transistor voltage levels. The controller may monitor the average DC voltage levels of transistors, and if determined that the voltage levels of the back-gate, the substrate, or the well are drifting from desired levels, the controller may control the switch 124 to enter the reset phase.

By virtual floating one of back-gate, substrate, and well of the transistor 110, the parasitic capacitances of the transistor 110 may appear in series with the capacitances of the well, the substrate, the back-gate, and hence there effective capacitance value on the output node is greatly reduced, particularly in the lower frequency range.

Figure 4:
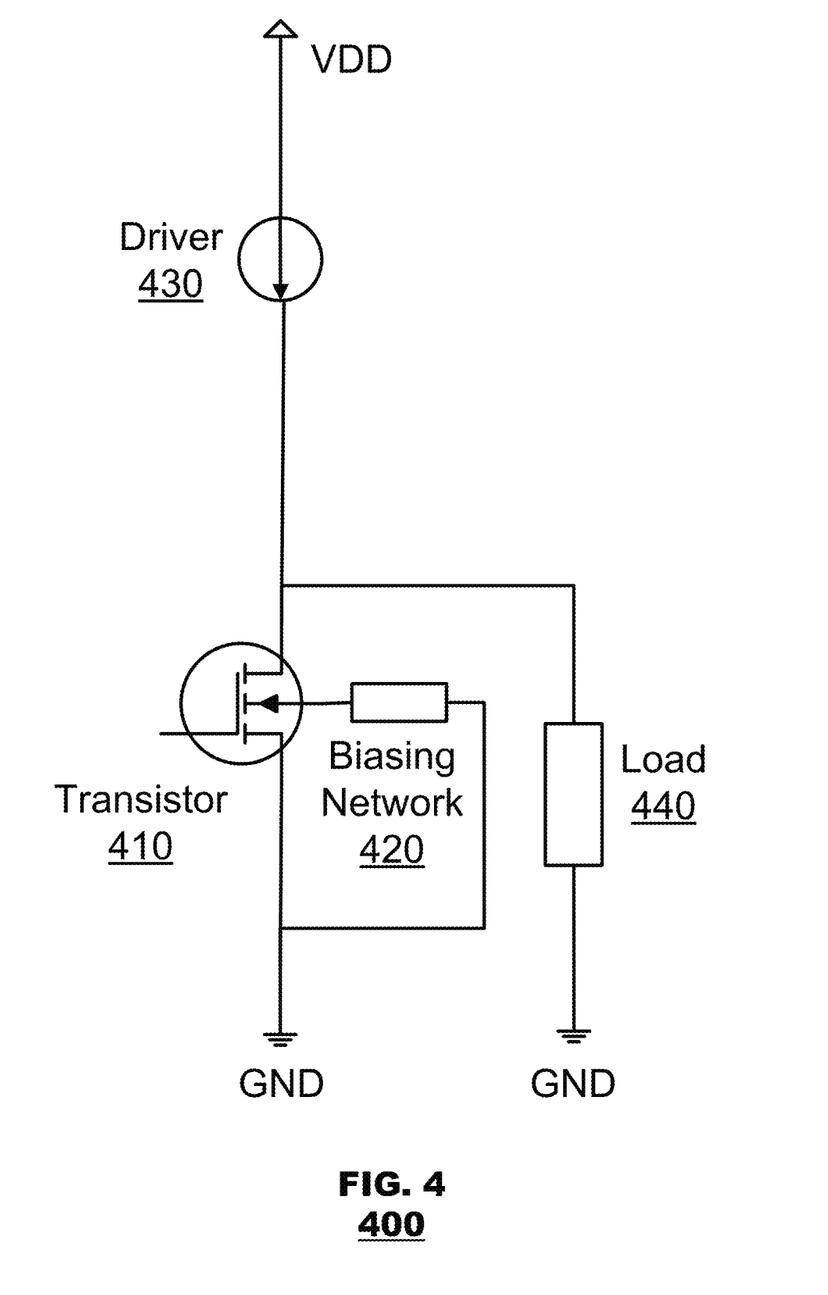
FIG. 4 illustrates a circuit according to an embodiment of the present disclosure.

According to an embodiment illustrated in FIG. 4, a circuit 400 may include a transistor 410, and a biasing network 420. The transistor 410 may be output on an output node to drive a load 440. The biasing network 420 may be connected to the transistor 410 to bias at least one of a substrate, a deep N well, and a back-gate of the transistor 410 (P-type) to a virtual floating bias, such that at least one of a substrate, a well, and a back-gate of the transistor 410 shifts in voltage level when the output node outputs an AC signal.

In FIG. 4, circuit 400 may be an amplifier circuit. Transistor 410 may be a NMOS (N-type Metal Oxide Silicon) transistor. Transistor 410 may have a gate connected to an input AC signal to be amplified. Driver 430 may be a current driver connected in series with the transistor 410 between supplies VDD and GND, to generate the output node to drive the load 440.

Alternatively, transistor 410 may be a current driving transistor configured to bias a current through the amplifier circuit 400. In such a case, the driver 430 may receive the input signal to be amplified.

In the above configurations, transistor 410 may be connected to GND on its source node, to the output node on its drain node, and in series with the biasing network 420 to the supply GND. The transistor 410 may have one of its back-gate, substrate, and well connected to the biasing network 420, such that the biasing network 420 controls the biasing on one of the back-gate, substrate, and well of the transistor 410 to be a virtual floating bias. The virtual floating bias may be such that when the output of the transistor 410 outputs lower frequency range signals, one of its back-gate, substrate, and well of the transistor 410 appears to be floating, i.e. able to shift voltage level according to the signal at the input and the output.

Figure 5:
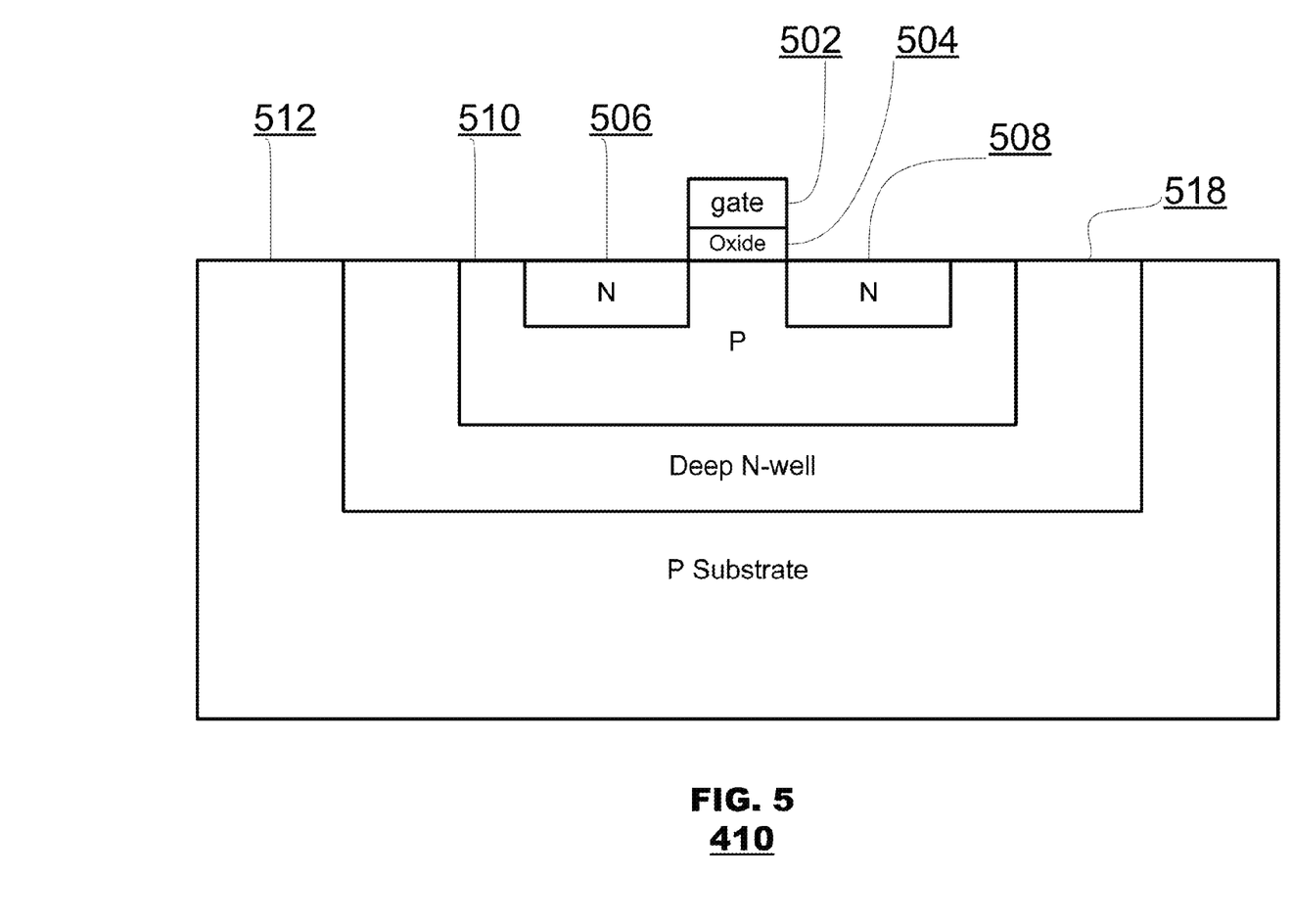
FIG. 5 illustrates a cross-sectional diagram of a transistor in a circuit according to an embodiment of the present disclosure.

FIG. 5 illustrates an idealized cross-sectional diagram of the transistor 410.

The transistor 410 may be a NMOS with a gate 502 with a gate oxide layer 504, a N-doped source region 506, a N-doped drain region 508, a P-doped well region 510 (backgate), a deep N-doped well region 518, a P type substrate 512.

According to an embodiment implemented in circuit 400, the transistor 410 may have one of its P-doped well region 510, deep N-doped well region 518, P type substrate 512, and back-gate 514 connected to biasing network 420. Various taps, such as diffusion or metal taps, may be implemented in the above portions of transistor 410 to connect to the biasing network 420. Additionally, the biasing network 420 may be connected to DC biasing voltages, to prevent forward biasing substrate junctions of the transistor 410.

Figure 6:
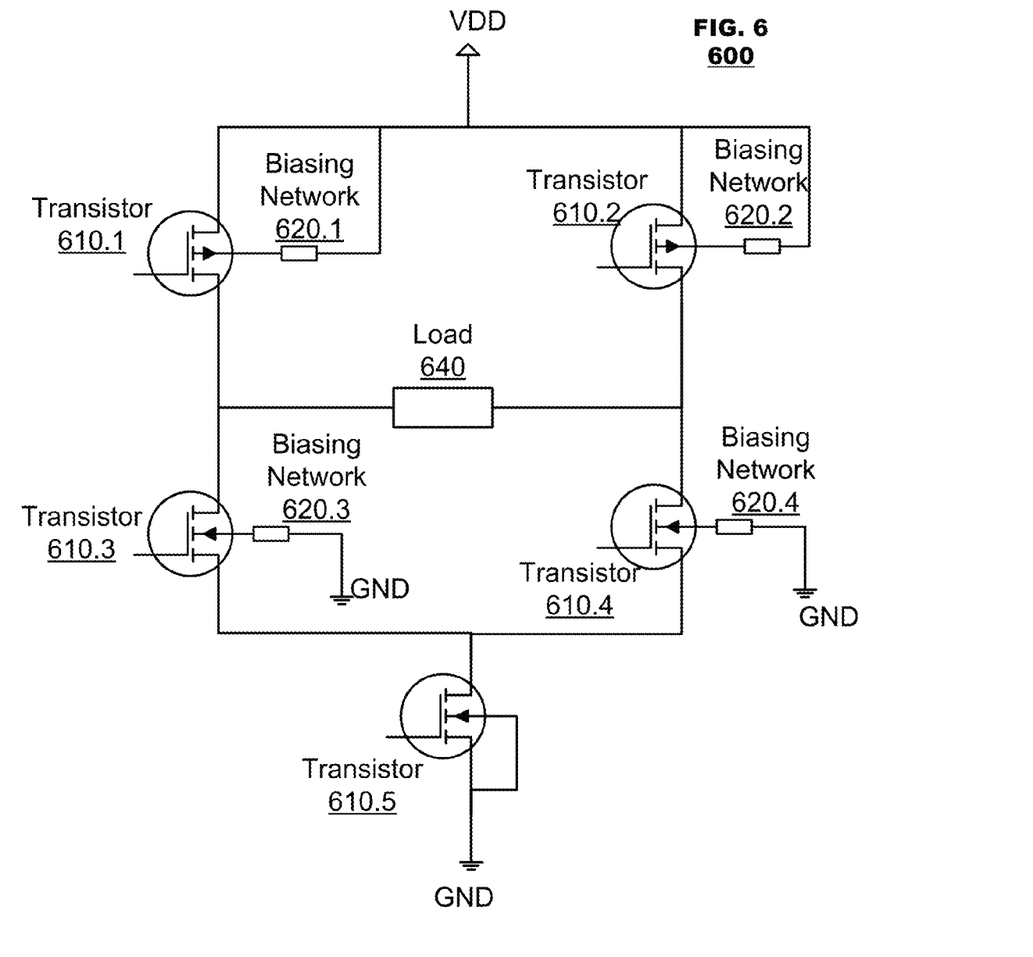
FIG. 6 illustrates a circuit according to an embodiment of the present disclosure.

FIG. 6 illustrates a circuit 600 according an embodiment.

Circuit 600 may include a plurality of transistors 610.1-610.5 and a plurality of biasing networks 620.1-620.4, configured in similar manners as in circuits 100 and circuits 400 of FIGS. 1 and 4. Circuit 600 may be configured as a differential pair amplifier driving differential outputs connected to a load 640. Circuit 600 may be configured as a differential pair amplifier where each differential branch may be configured as a cascode amplifier.

Transistors 610.1-610.4 may be connected to the differential output nodes on their respective drain nodes, and transistor 610.5 may be a biasing transistor. According to an embodiment, only the transistors 610.1-610.4 which are connected directly on their drain or source nodes to the output nodes, need to be connected to a respective biasing network 620.1-620.4. Thus, transistor 610.5 may not need to have its own biasing network, and may be directly connected to a DC bias (for example GND) on its substrate, well, and/or back-gate. Transistors 610.1-610.4 may share a single biasing network, or have separate biasing networks, with same or separate biasing nodes implementing separate or connected virtual floating biases. The biasing networks 620.1-620.4 may be implemented on the same circuit unit or chip as the transistors 610.1-610.4 or on separate circuit units or chips.

Transistors 610.1 and 610.2 may be PMOS transistors as similar to transistor 110 in FIGS. 1 and 2, and transistors 610.3 and 610.4 may be NMOS transistors as similar to transistor 410 in FIGS. 4 and 5.

Figure 7:
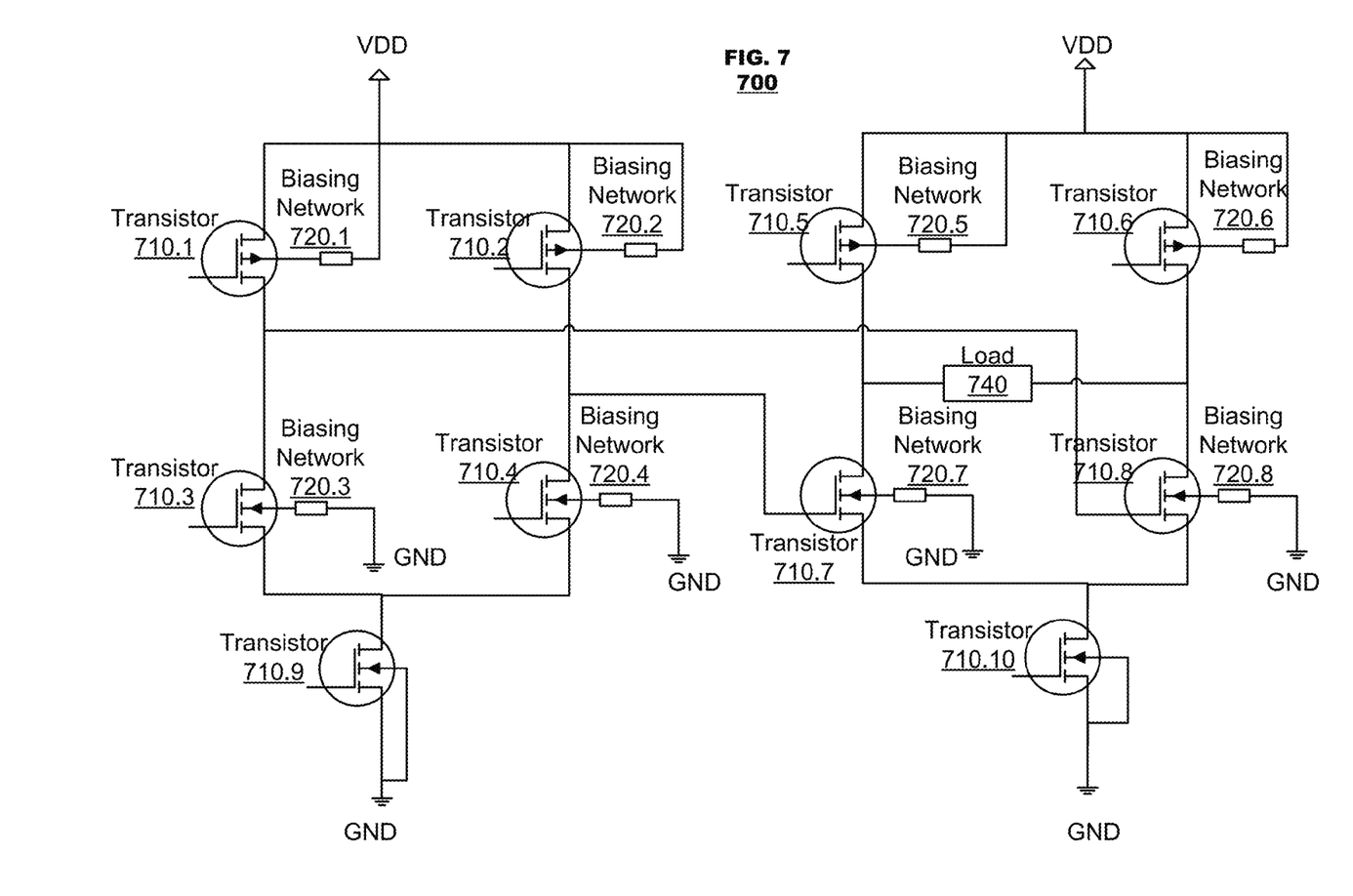
FIG. 7 illustrates a circuit according to an embodiment of the present disclosure.

FIG. 7 illustrates a circuit 700 according an embodiment.

Circuit 700 may include a plurality of transistors 710.1-710.10 and a plurality of biasing networks 720.1-720.8, configured in similar manners as in circuits 100 and circuits 400 of FIGS. 1 and 4. Circuit 700 may be configured as a two-staged differential pair amplifier driving differential outputs connected to a load 740. Circuit 700 may be configured as a two-staged differential pair amplifier where each differential branch may be configured as a cascode amplifier.

Transistors 710.1-710.8 may be connected to the differential output nodes on their respective drain nodes, and transistors 710.9 and 710.10 may be biasing transistors. According to an embodiment, only the transistors 710.1-710.8 which are connected directly on their drain or source nodes to the output nodes, need to be connected to a respective biasing network 720.1-720.8. Thus, transistors 710.9 and 710.10 may not need to have its own biasing network, and may be directly connected to a DC bias (for example GND) on its substrate, well, and/or back-gate. Transistors 710.1-710.8 may share a single biasing network, or have separate biasing networks, with same or separate biasing nodes implementing separate or connected virtual floating biases. The biasing networks 720.1-720.8 may be implemented on the same circuit unit or chip as the transistors 710.1-710.8 or on separate circuit units or chips.

Transistors 710.1-710.2 and 710.5-710.6 may be PMOS transistors as similar to transistor 110 in FIGS. 1 and 2, and transistors 710.3-710.4 and 710.7-710.8 may be NMOS transistors as similar to transistor 410 in FIGS. 4 and 5.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions.

Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

I claim:

1. A circuit, comprising:
   one or more transistors connected directly to an output; and
   a biasing network connected to at least one of a substrate, a well, and a back-gate of at least one of the transistors, wherein
      the biasing network biases the at least one of the substrate, the well, and the back-gate to a DC voltage during a reset phase, and
      the biasing network biases the at least one of the substrate, the well, and the back-gate to a virtual floating bias during an operational phase, such that the virtual floating bias shifts in voltage level based upon an AC input signal of the circuit.

2. The circuit of claim 1, wherein at least two transistors of the one or more transistors are connected in series with each other to form an amplifier.

3. The circuit of claim 1, wherein the biasing network comprises one of a switch and a resistor.

4. The circuit of claim 1, wherein the biasing network comprises a resistor that is connected to the at least one of the transistors at a first terminal and connected to a DC voltage at a second terminal.

5. The circuit of claim 1, wherein the biasing network comprises a switch that is connected to the at least one of the transistors at a first terminal, a DC voltage at a second terminal, and a floating node at a third terminal, wherein the switch adjusts biasing by switching between the second terminal and the third terminal.

6. The circuit of claim 5, wherein the switch adjusts biasing by switching to the second terminal during the reset phase of the circuit, and switching to the third terminal during the operational phase of the circuit.

7. The circuit of claim 5, wherein a controller controls the switch to adjusts biasing based upon monitoring of voltage of the at least one of the substrate, the well, and the back-gate of the at least one of the transistors.

8. An amplifier, comprising:
   a plurality of transistors connected directly to an output;
   an input to which an AC input signal is applied to control one or more of the plurality of transistors; and
   a biasing network connected to at least one of a substrate, a well, and a back-gate of at least one of the transistors, wherein
      the biasing network biases the at least one of the substrate, the well, and the back-gate to a DC voltage during a reset phase, and
      the biasing network biases the at least one of the substrate, the well, and the back-gate to a virtual floating bias during an operational phase, such that the virtual floating bias reduces parasitic capacitance of the output.

9. The amplifier of claim 8, wherein at least two transistors of the plurality of transistors are connected in series with each other.

10. The amplifier of claim 8, wherein the biasing network comprises one of a switch and a resistor.

11. The amplifier of claim 8, wherein the biasing network comprises a resistor that is connected to the at least one of the transistors at a first terminal and connected to a DC voltage at a second terminal.

12. The amplifier of claim 8, wherein the biasing network comprises a switch that is connected to the at least one of the transistors at a first terminal, a DC voltage at a second terminal, and a floating node at a third terminal, wherein the switch adjusts biasing by switching between the second terminal and the third terminal.

13. The amplifier of claim 12, wherein the switch adjusts biasing by switching to the second terminal during the reset phase of the circuit, and switching to the third terminal during the operational phase of the amplifier.

14. The amplifier of claim 12, wherein a controller controls the switch to adjusts biasing based upon monitoring of voltage of the at least one of the substrate, the well, and the back-gate of the at least one of the transistors.

15. A circuit, comprising:
   one or more transistors connected directly to an output; and
   a biasing network connected to at least one of a substrate, a well, and a back-gate of at least one of the transistors, wherein the biasing network biases the at least one of the substrate, the well, and the back-gate to a DC voltage during a reset phase, and the biasing network biases the at least one of the substrate, the well, and the back-gate to a virtual floating bias during an operational phase, such that the virtual floating bias increases a frequency of a non-dominant frequency response pole of an AC input signal of the circuit.

16. The circuit of claim 15, wherein at least two transistors of the one or more transistors are connected in series with each other to form an amplifier.

17. The circuit of claim 15, wherein the biasing network comprises one of a switch and a resistor.

18. The circuit of claim 15, wherein the biasing network comprises a resistor that is connected to the at least one of the transistors at a first terminal and connected to a DC voltage at a second terminal.

19. The circuit of claim 15, wherein the biasing network comprises a switch that is connected to the at least one of the transistors at a first terminal, a DC voltage at a second terminal, and a floating node at a third terminal, wherein the switch adjusts biasing by switching between the second terminal and the third terminal.

20. The circuit of claim 19, wherein the switch adjusts biasing by switching to the second terminal during the reset phase of the circuit, and switching to the third terminal during the operational phase of the circuit.

* * * * *